United States Patent
Iwai et al.

(10) Patent No.: US 11,765,829 B2
(45) Date of Patent: Sep. 19, 2023

(54) DISPLAY DEVICE AND ELECTRONIC DEVICE

(71) Applicant: Japan Display Inc., Tokyo (JP)

(72) Inventors: Youhei Iwai, Tokyo (JP); Hideaki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 150 days.

(21) Appl. No.: 17/366,238

(22) Filed: Jul. 2, 2021

(65) Prior Publication Data
US 2021/0337667 A1 Oct. 28, 2021

Related U.S. Application Data

(63) Continuation of application No. PCT/JP2019/050835, filed on Dec. 25, 2019.

(30) Foreign Application Priority Data

Jan. 7, 2019 (JP) ................................. 2019-000514

(51) Int. Cl.
*H05K 1/18* (2006.01)
*H05K 1/14* (2006.01)
(Continued)

(52) U.S. Cl.
CPC ................ *H05K 1/14* (2013.01); *H05K 1/028* (2013.01); *G02F 1/13452* (2013.01); *H05K 2201/10128* (2013.01); *H10K 59/131* (2023.02)

(58) Field of Classification Search
CPC ..................... H05K 1/14; H05K 1/028; H05K 2201/10128; G02F 1/13452; H01L 27/3276
(Continued)

(56) References Cited

U.S. PATENT DOCUMENTS 5,266,746 A * 11/1993 Nishihara ............. H05K 1/118
361/779
9,560,761 B2 1/2017 Kishida et al.
(Continued)

FOREIGN PATENT DOCUMENTS

JP H03-065925 A 3/1991
JP 2009-168904 A 7/2009
(Continued)

OTHER PUBLICATIONS

Japanese Office Action dated Mar. 15, 2022, for the corresponding Japanese Patent Application No. 2020-565694, with English computer translation.
(Continued)

*Primary Examiner* — Binh B Tran
(74) *Attorney, Agent, or Firm* — Michael Best & Friedrich LLP

(57) ABSTRACT

To mitigate a bending stress in the flexible wiring substrate in a structure, a display panel, to which the flexible wiring substrate connects, is curved along a first direction, and the flexible wiring is bent back to the rear of the display panel. The flexible wiring substrate connects with the display panel at a first region and at a second region; the flexible wiring substrate connects with the wiring substrate at a third region and at a fourth region. The flexible wiring substrate has a narrowest width in the first direction at an intermediate region between the display panel and the wiring substrate. A first wiring group in the flexible wiring substrate connects the first region with the third region or the fourth region, a second wiring group in the flexible wiring substrate connects the second region with another one of the third region or the fourth region.

15 Claims, 19 Drawing Sheets

(51) Int. Cl.
*H05K 1/02* (2006.01)
*G02F 1/1345* (2006.01)
*H10K 59/131* (2023.01)

(58) Field of Classification Search
USPC .......................................................... 361/749
See application file for complete search history.

(56) References Cited

U.S. PATENT DOCUMENTS

| 9,888,582 B2* | 2/2018 | Jo .......................... H05K 3/361 |
| 2006/0192496 A1* | 8/2006 | Yamada .............. H01L 51/0097 |
| | | 315/169.3 |

FOREIGN PATENT DOCUMENTS

| JP | 2011-169983 A | 9/2011 |
| JP | 2018-073705 A | 5/2018 |
| JP | 2019-184755 A | 10/2019 |
| KR | 10-2007-0116371 A | 12/2007 |

OTHER PUBLICATIONS

International Search Report dated Dec. 25, 2019 for the corresponding PCT Application No. PCT/JP2019/050835, with English machine translation.

* cited by examiner

DISPLAY DEVICE AND ELECTRONIC DEVICE

The present application is a continuation application of International Application No. PCT/JP2019/050835, filed on Dec. 25, 2019, which claims priority to Japanese Patent Application No. 2019-000514, filed on Jan. 7, 2019. The contents of these applications are incorporated herein by reference in their entirety.

BACKGROUND OF THE INVENTION

(1) Field of the Invention

The present invention relates to display devices especially to the display devices in which the substrates can be used in bent state.

The present invention further relates to several electronic devices including display devices, sensors and so forth, in which the flexible wiring substrates are used.

(2) Description of the Related Art

Self-luminous type display devices like the organic EL display device, the micro-LED display device and so forth, and other display devices like the liquid crystal display device and so forth are sometimes required to be used in curved state because of their applications and their design needs. In addition, not only display devices but also touch panels or sensor substrates, e.g. photo sensors, are also sometimes required to be used in curved state according a design of equipment in which those devices are installed. Curving directions in the display devices and the sensor substrates are defined along the lateral direction (may be referred to as x axis direction herein after) or along the longitudinal direction (may be referred to as y axis direction herein after).

The flexible wiring substrates are used to supply the power and signals to the display devices and the sensor substrates; the flexible wiring substrates are used in a bent state to avoid the outer sizes of the display devices and the sensor substrates become too large. Patent documents 1 and 2 disclose that plural flexible wiring substrates are connected to one side of the display device.

In many cases, the flexible wiring substrates are used in a folded state to make the display devices thin. In such a case, if the side of the display device, to which the flexible wiring substrate is connected, is bent, the flexible wiring substrate receives a strong stress in a folding direction. Patent document 3 discloses to form a slit in the flexible substrate to mitigate the stress.

In a state in which the flexible wiring substrates are used in a folded state, there occurs a chance of short circuit between the wirings of the flexible wiring substrate and the wiring in another substrate when the flexible wiring substrate is being connected. Patent document 4, to countermeasure this problem, discloses to form the connecting terminals and the wirings separately on the different surfaces, namely, the front surface and the back surface of the flexible wiring substrate.

Patent document 1: Japanese patent application laid open No. 2009-168904
Patent document 2: U.S. Pat. No. 9,560,761
Patent document 3: Japanese patent application laid open No. Hei 3-65925
Patent document 4: Japanese patent application laid open No. 2011-169983

SUMMARY OF THE INVENTION

When the flexible wiring substrate is connected along the curved side of the substrate, in addition, when the flexible substrate is bent or folded, the stresses in complex directions are generated in the flexible wiring substrate. At the same time, the portion of the display device, to which the flexible wiring substrate is connected, receives the stresses as a reaction.

When the glass substrate is used in the display device or in the sensor device, the glass substrate must be thin so that it can be curved. In such a case, the glass substrate may be broken by the stresses when the flexible wiring substrate is bent. On the other hand, when the resin substrate is used, the curvature of the display device or sensor substrate is changed at the connecting portion with the flexible wiring substrate due to the stresses when the flexible wiring substrate is bent.

The stress may be mitigated by separating the flexible wiring substrate in plural part; however, there are cases that the flexible wiring substrate must be separated in many parts according to the curvature of the side of the display panel. On the other hand, when a slit is formed in the flexible wiring substrate, in many cases, there is a chance that enough stress mitigation is not attained according to the wiring layout in the flexible wiring substrate.

The purpose of the present invention is to realize a structure to reduce the stress in the connecting portion of the curved side of the display device or the sensor substrate to which the flexible wiring substrate is connected even when the flexible wiring substrate is bent or folded; and consequently, to realize the display devices and the sensor devices that can be adopted in various usages.

The present invention overcomes the above explained problem; the concrete structures are as follows.

(1) An electronic device including a X shaped flexible wiring substrate in a plan view.

(2) A display device including:
a display panel having a first side extending in a first direction,
a wiring substrate having a second side extending in the first direction,
a flexible wiring substrate connecting the display device with the wiring substrate in a second direction, which intersects with the first direction,
in which the flexible wiring substrate connects with the display panel at a first region and a second region, the first region and the second region are separated in the first direction,
the flexible wiring substrate connects with the wiring substrate at a third region and a fourth region, the third region and the fourth region are separated in the first direction,
the flexible wiring substrate has a first wiring group, which extends obliquely with the first direction or the second direction, and a second wiring group, which extends obliquely with the first direction or the second direction,
the first wiring group connects the first region with either one of the third region and the fourth region,
the second wiring group connects the second region with either another one of the third region and the fourth region,
the flexible wiring substrate has a width w1 in the first direction between an outer edge of the first region and an outer edge of the second region, the flexible wiring substrate has a width w2 in the first direction between an outer edge of the third region and an outer edge of the fourth region, the flexible wiring substrate has a portion of shortest width w3 in the first direction between the first region and the third region, and between the second region and the fourth region.

(3) A display device including:

a display panel having a first side extending in a first direction, a wiring substrate having a second side extending in the first direction, a first flexible wiring substrate connecting the display device with the wiring substrate in a second direction, which intersects with the first direction, a second flexible wiring substrate connecting the display device with the wiring substrate in the second direction, in which the first flexible wiring substrate connects with the display panel at a first region, and connects with the wiring substrate at a third region, the first region and the third region are connected to each other by a first wiring group, the second flexible wiring substrate connects with the display panel at a second region, and connects with the wiring substrate at a fourth region, the second region and the fourth region are connected to each other by a second wiring group, the first wiring group of the first wiring substrate has a first V shape including a first vertex in the first direction between the first region and the third region, the second wiring group of the second wiring substrate has a second V shape including a second vertex in a reverse direction to the first direction between the second region and the fourth region, the first flexible wiring substrate and the second flexible wiring substrate overlap at an overlapping portion as that the first V shape and the second V shape overlap, in an assembled state of the first flexible wiring substrate and the second wiring substrate, the first region and the second region are separated in a plan view, the third region and the fourth region are separated in a plan view, a width in the first direction between an outer edge of the first region and an outer edge of the second region is w1, a width in the first direction between an outer edge of the third region and an outer edge of the fourth region is w2, a narrowest width w3 in the first direction exists at the overlapping portion.

(4) A display device including:

a display panel having a first side extending in a first direction, a wiring substrate having a second side extending in the first direction, a first flexible wiring substrate connecting the display device with the wiring substrate in a second direction, which intersects with the first direction, a second flexible wiring substrate connecting the display device with the wiring substrate in the second direction, in which the first flexible wiring substrate connects with the display panel at a first region, and connects with the wiring substrate at a fourth region, the first region and the fourth region are connected by a first wiring group, the second flexible wiring substrate connects with the display panel at a second region, and connects with the wiring substrate at a third region, the second region and the third region are connected to each other by a second wiring group, the first wiring group of the first wiring substrate extends straightly and diagonally between the first region and the fourth region, the second wiring group of the second wiring substrate extends straightly and diagonally between the second region and the third region, the first flexible wiring substrate and the second flexible wiring substrate cross and overlap at an overlapping portion between the first region and the fourth region and between the second region and the third region, in an assembled state of the first flexible wiring substrate and the second wiring substrate, the first region and the second region are separated in a plan view, the third region and the fourth region are separated in a plan view, a width in the first direction between an outer edge of the first region and an outer edge of the second region is w1, a width in the first direction between an outer edge of the third region and an outer edge of the fourth region is w2, a narrowest width w3 in the first direction exists at the overlapping portion.

DETAILED DESCRIPTION OF THE PREFERRED EMBODIMENTS

The present invention will be described in detail referring to the following embodiments. The present invention will be used in various display devices having electro optic layers as the liquid crystal display devices, the electrophoresis display devices and so forth, and further the self-luminescent display devices as the organic EL display devices, the micro LED display devices and so forth. The present invention will also be used in various sensor devices such as the external touch sensors or the figure print sensors and so forth.

Naturally, the present invention can also be used in other electronic devices other than the display devices and the sensor devices.

The display device in the following embodiments can be substituted by the sensor substrate of the sensor device or the substrate of the electronic device to which the flexible wiring substrate is connected.

Embodiment 1

Figure 1:
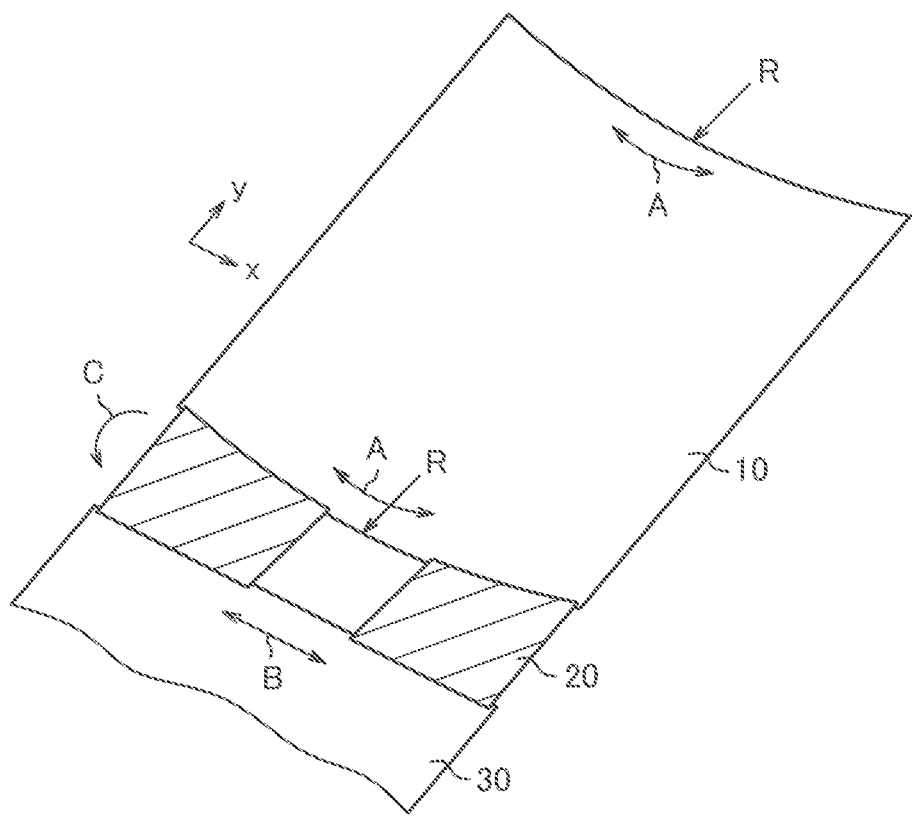
FIG. 1 is a perspective view of the display device as a comparative example.

FIG. 1 is a perspective view of the display device as a comparative example. In FIG. 1, the display panel 10 is curved like an arrow A in the x axis direction by radius of curvature of R. The display panel 10 may be the liquid crystal display panel, the organic EL display panel, or other thin display panels that can be curved. The flexible wiring substrate 20, which supplies the power or signals to the display panel 10, is connected to the curved side of the display panel 10. The wiring substrate 30 connects to the other side of the flexible wiring substrate 20. The wiring substrate 30 is, e.g. a PCB substrate, rigid and straight in the x axis direction as depicted by arrow B in FIG. 1. The wiring substrate 30, however, can be curved in a direction along the curve of the display panel 10.

As a result, a twist stress is generated in the flexible wiring substrate 20 even in a state of FIG. 1. In FIG. 1, the flexible wiring substrate 20 is expected to be folded back in the direction of arrow C to make the size of the display device compact and thin. When the flexible wiring substrate 20 is folded back, bending forces are applied from two directions in the flexible wiring substrate 20; consequently, complex and large stresses are generated in the flexible substrate 20. Therefore, it is very difficult to bend the flexible wiring substrate 20 in the direction shown by arrow C because of the stresses due to bending or twisting caused by connecting the flexible wiring substrate 20 to the curved side of the display panel 10; bending the flexible wiring substrate forcibly causes a breaking of the display panel 10 or severe deformation in the flexible wiring substrate 20. Even if the flexible wiring substrate 20 could be bent, after it is connected to the curved side of the display 10, there could be a chance of disconnection between the flexible wiring substrate 20 and the display panel 10. Further, the flexible wiring substrate 20 will come off from the display panel 10.

The flexible wiring substrate 20 is formed as that the wirings made of e.g. cupper are formed on the resin substrate made from e.g. polyimide. The polyimide, constituting substrate, is mechanically strong, thus, there is less danger that the polyimide substrate is broken. On the other hand, the same stress generated in the flexible wiring substrate 20 is also applied to the display panel 10 as a reaction. When the substrate 10 is made of glass, a thickness is made as thin as 0.2 mm or less so that it can be curved; thus, there is a chance that the glass substrate 10 is broken. When the substrate 10 is made of resin, there is less chance that the substrate 10 is broken; however, the curvature of the display panel 10 is changed because of the reaction. Therefore, the stress formed in the flexible wiring substrate 20 in the following explanation can be paraphrased as the stress in the display panel 10.

In the meantime, the reaction of the stress generated in the flexible wiring substrate 20 is also applied to the wiring substrate 30; however, the wiring substrate 30 is formed from mechanically strong resin, thus, a possibility that the substrate 30 is broken is very low. In addition, a change in curvature in the wiring substrate 30 does not raise a problem. Therefore, in the explanation herein after, the reaction means a reaction generated in the display panel 10.

FIG. 1 is a structure of the flexible wiring substrate 20 being divided into two rectangular flexible wiring substrates 20 to mitigate the stress in the flexible wiring substrate 20. The structure of FIG. 1, however, does not give enough stress relief. Specifically, where the flexible wiring substrates 20 are folded back in the direction of arrow C, the display panel may be broken if the glass substrate is thin. In addition, since the flexible wiring substrate 20 is also curved along the curve of the side of the display panel 10, it is difficult to fold back the flexible wiring substrate 20; if the flexible substrate 20 is forcibly folded back as shown by arrow C, the display panel 10 is deformed severely.

Figure 2:
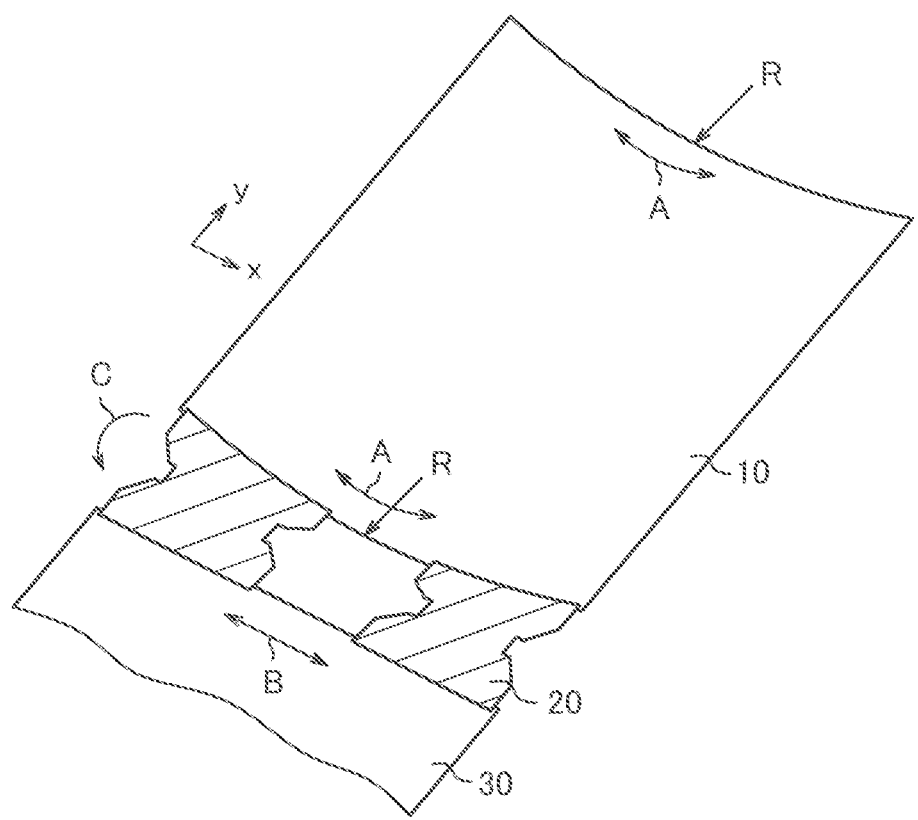
FIG. 2 is perspective view of the display device as another comparative example.

FIG. 2 is a perspective view of comparative example which countermeasures the above explained problem. In FIG. 2, the display panel 10 and the wiring substrate 30 are the same as explained in FIG. 1. The flexible wiring substrate 20 is divided into two; the plan view of each of the flexible wiring substrate 20 is an hourglass shape. In such a flexible wiring substrate 20, the stress is mitigated when it is bent because the narrowed portion is easy to be bent. However, even the structure of FIG. 2 does not give enough stress relief.

Figure 3:
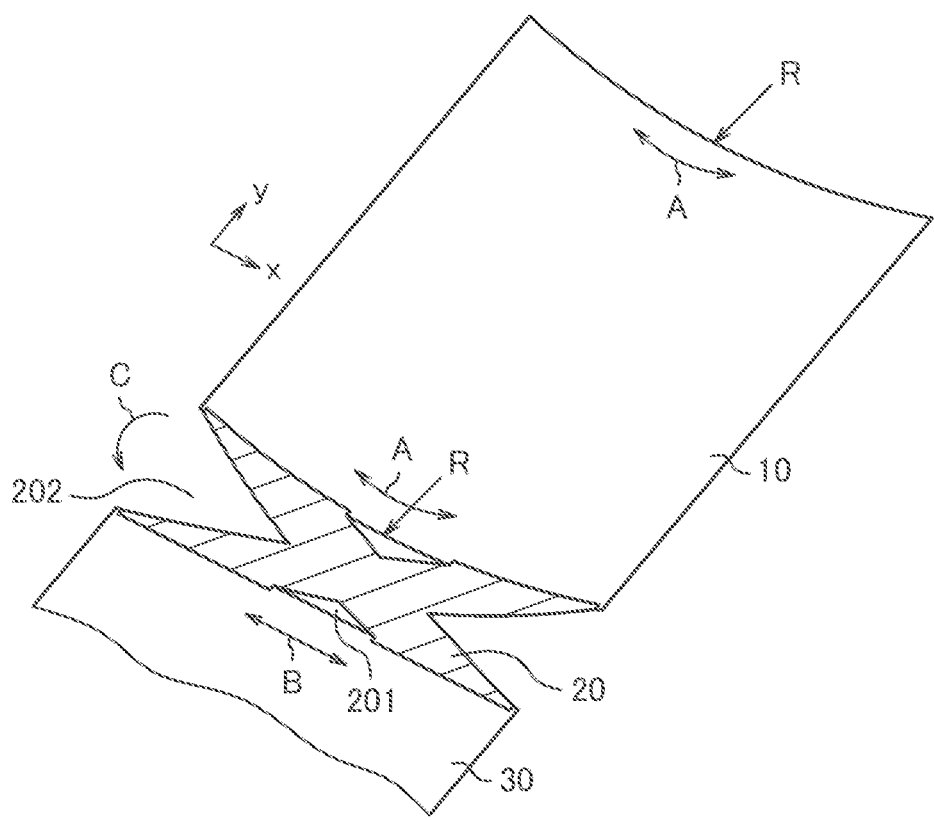
FIG. 3 is a plan view of the display device according to the present invention.

FIG. 3 is a perspective view of the display device according to the present invention. In FIG. 3, the display panel 10 and the wiring substrate 30 are the same as explained in FIG. 1. The plan view of the flexible wiring substrate of 20 is X shaped in FIG. 3. Namely, in a plan view, the delta shaped cut out 201 is formed at the upper side and the lower side (in y direction); the delta shaped cut out 202 is formed at the left side and the right side (in x direction).

A width of the flexible wiring substrate 20 in y direction becomes narrower in going to the edge of the display panel in direction x along the connection portion. Since a width of the flexible wiring substrate is least at the largest displacement portion when the display panel 10 is curved as shown by arrow A in FIG. 3, the stress in the flexible wiring substrate 20 is low. In addition, a width of the flexible wiring substrate 20 in y direction at the center in x direction is small due to the cut out 201, the flexible wiring substrate is easier to be bent in x axis direction; thus, the stress is further mitigated. At the same time, the reaction to the display device 10 is also reduced.

When the flexible wiring substrate 20 is bent or folded as shown by arrow C in FIG. 3, a bending stress is mitigated because a width in x direction of the flexible wiring substrate 20 at the center in y direction is small due to the existence of the delta shaped cut out 202.

As a result, the stresses in the flexible wiring substrate 20 are mitigated in cases both when the flexible wiring is curved as shown by arrow A and when it is folded back as shown by arrow C in the structure of FIG. 3. At the same time, the stress in the display panel 10 caused by the reaction from the stress of the flexible wiring substrate 20 is mitigated.

Figure 4:
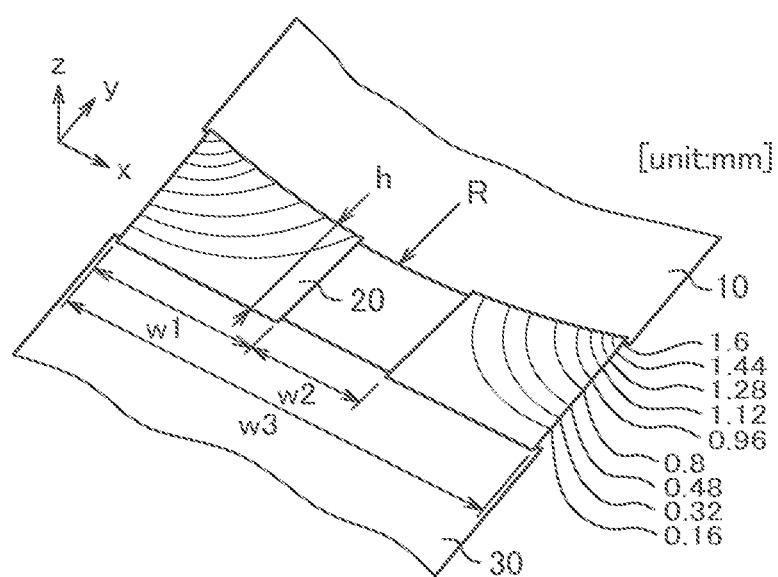
FIG. 4 is a plan view that shows displacements of the flexible wiring substrate when the display panel is curved in the comparative example.
Figure 5:
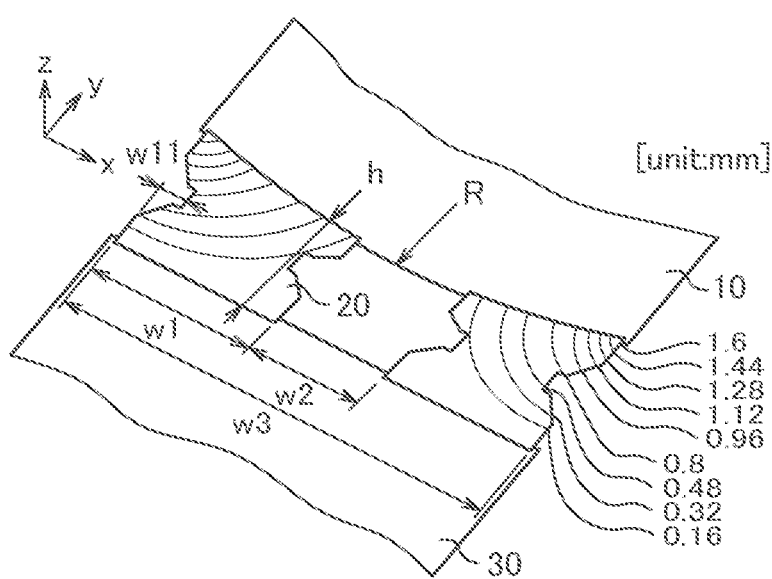
FIG. 5 is a plan view that shows displacements of the flexible wiring substrate when the display panel is curved in the other comparative example.
Figure 6:
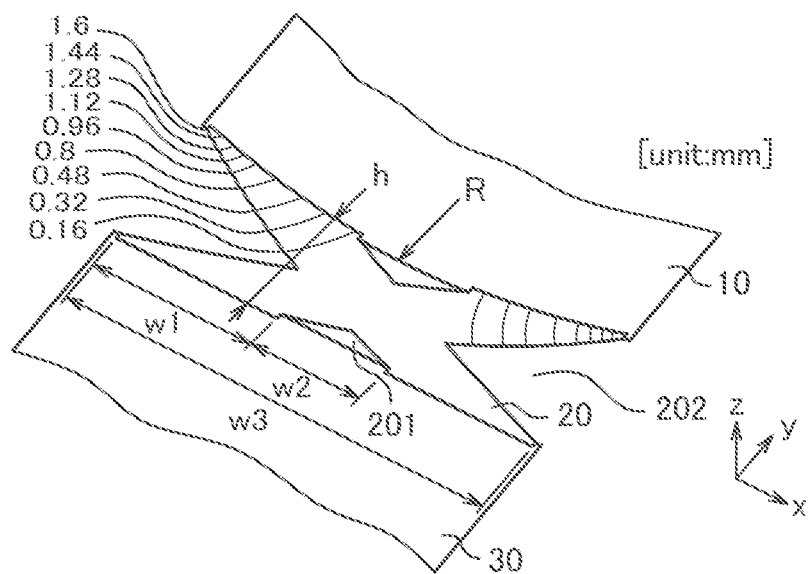
FIG. 6 is a plan view that shows displacements of the flexible wiring substrate when the display panel is curved in the present invention.

FIGS. 4 to 6, which correspond to FIGS. 1 to 3, are perspective views that show displacements in the flexible wiring substrate 20 when the display panel 10 is curved by a radius of curvature R while the wiring substrate 30 is kept flat. In FIGS. 4 to 6, the width w3 and the radius of curvature R of the flexible wiring substrate 20 are the same. The radius of curvature R is selected as the camber is 1.6 mm when a chord of the arc w3 is 97.6 mm. In FIGS. 4 to 6, in x direction in the flexible wiring substrates 20, the width w1=36 mm, the gap or the cut out w2=25.6 mm, and the width w3=97.6 mm are common. The length h=24 mm in y direction of the flexible wiring substrates 10 is common in FIGS. 4 to 6.

In FIG. 4, w1 is a width of each of the flexible wiring substrate 20; w2 is a space between the two flexible wiring substrates 20; w3 is a width of outer edge to outer edge of two flexible wiring substrates 20. In FIG. 4, numbers connoted to the contours in the flexible substrate 20 correspond to displacements in z direction from the tangent plane to the flexible wiring substrate 20.

As shown in FIG. 4, the displacement, which is 1.6 mm, is largest at the outer most edges of the two flexible wiring substrates 20 in the connecting side with the display panel 10. The displacement gradually decreases approaching to zero in going to the inner edge of the flexible wiring substrate 20 at the connecting side with the display panel 10.

FIG. 5 shows displacements of the flexible wiring substrate 20 when a plan view of the flexible wiring substrate 20 is like the hour glass. In FIG. 5, notations of R, w1, w2, and w3 are the same as FIG. 4. The meaning of the contours is the same as explained in FIG. 4. In FIG. 5, a narrow portion exists, which is a feature of the hour glass, the amount of cut out w11 at the narrow portion is 6 mm.

The displacements of the flexible wiring substrate 20 in FIG. 5 are almost the same as the displacements in FIG. 4. Namely, the displacement, which is 1.6 mm, is largest at the outer most edges of the two flexible wiring substrates 20 at the connecting side with the display panel 10. The displacement gradually decreases approaching to zero in going to the inner edge of the flexible wiring substrate 20 in the connecting side with the display panel 10.

FIG. 6 shows displacements of the flexible wiring substrate 20 according to the present invention. In FIG. 6, the radius of curvature R is the same as in FIGS. 4 and 5. In FIG. 6, the flexible wiring substrate 20 is divided into two portions by delta shaped cut out 201 at the connecting side with the display panel 10; a width in x direction of each of the portions is w1, and a width in x direction of the cut out is w2; a width in x direction from outer edge to outer edge, namely, a total width of the flexible wiring substrate 20 is w1. The meaning of the contours in FIG. 6 is the same as explained in FIG. 4.

The displacements of the flexible wiring substrate 20 in FIG. 6 are very different from the displacements of the flexible wiring substrate 20 in FIGS. 4 and 5. The displacement, which is 1.6 mm, is largest at the outer most edges of the flexible wiring substrate 20 at the connecting side with the display panel 10. The displacement at the upper horn of the flexible wiring substrate 20 gradually decreases in going to the root of the horn; the displacement is almost zero at the center of the flexible wiring substrate 20.

Namely, in the flexible wiring substrate 20 according to the present invention, the bending stress is almost zero at the vicinity of the center of the flexible wiring substrate 20. Therefore, only a simple stress is generated when the flexible wiring substrate 20 with the wiring substrate 30 of FIG. 6 is bent back to the rear, which is the same as when a flat flexible wiring substrate is bent back to the rear.

Figure 7:
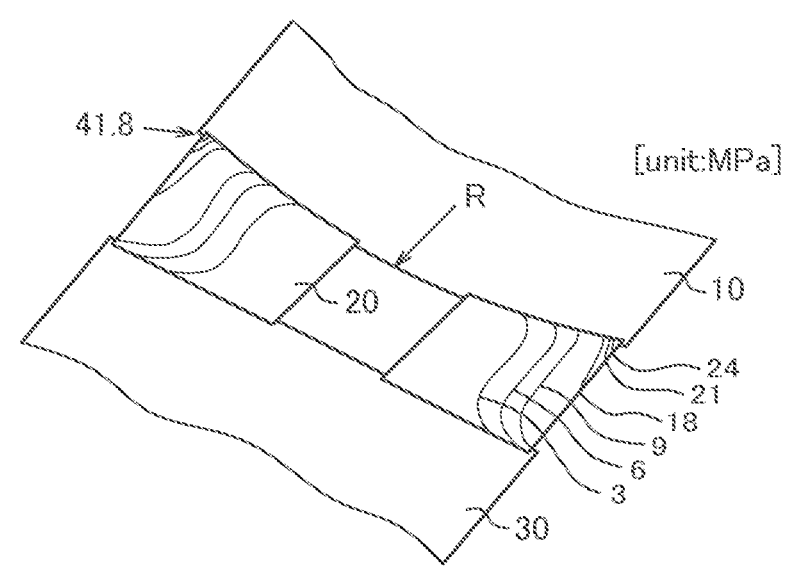
FIG. 7 is a plan view that shows stresses in the flexible wiring substrate when the display panel is curved in the comparative example.
Figure 8:
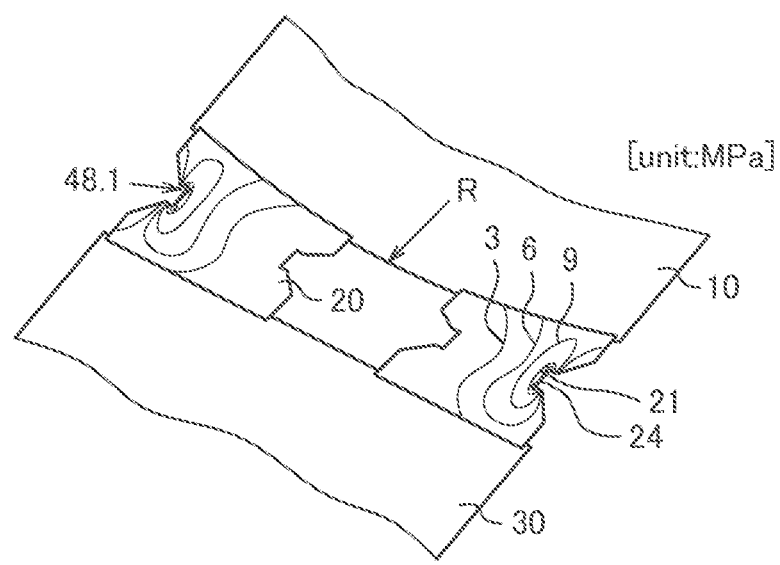
FIG. 8 is a plan view that shows stresses in the flexible wiring substrate when the display panel is curved in the other comparative example.
Figure 9:
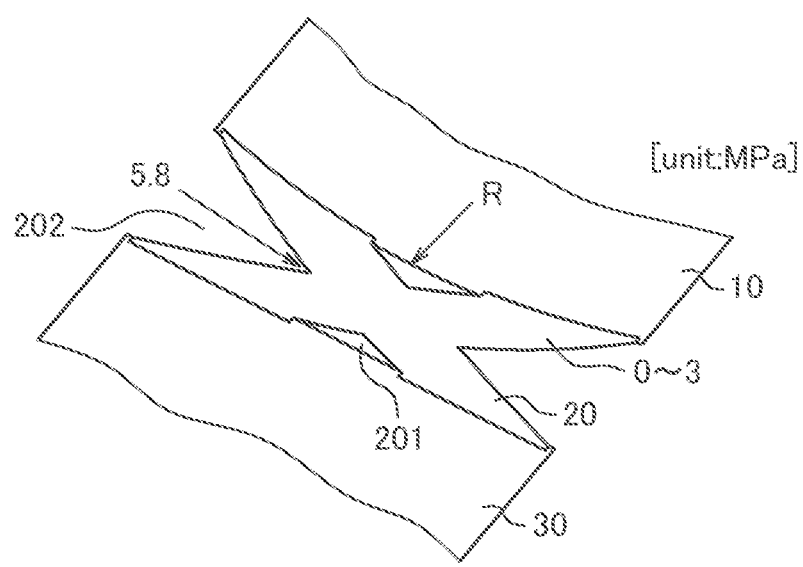
FIG. 9 is a plan view that shows stresses in the flexible wiring substrate when the display panel is curved in the present invention.

FIGS. 7 to 9, which correspond to FIGS. 4 to 6, show the stress distribution in the flexible wiring substrate 20. FIGS. 7 to 9 are expressed so called von Mises stress, which takes into account all the stresses in x direction, y direction and z direction, can evaluate the value of the stress regardless the directions of the stress.

FIG. 7 is a stress distribution when the flexible wiring substrate 20 of the first comparative example is bent as shown FIG. 4. The numbers corresponding to the contours in FIG. 7 are values of stress, the unit is MPa. The stress is large, as 24, at the outer edge of the flexible wiring substrate 20 in the connecting side with the display panel 10. The stress gradually becomes smaller in going to the inner edge of the flexible wiring substrate 20 in the connecting side with the display panel 10. The largest stress in FIG. 7 is 41.8. The same stress is generated at the corresponding edge of the display panel 10 as a reaction.

FIG. 8 is a stress distribution when the flexible wiring substrate 20 of the second comparative example is bent as shown FIG. 5. The numbers corresponding to the contours in FIG. 8 are the same as explained in FIG. 7. The largest stress in FIG. 8 is 48.1, which occurs at the narrow portion of the hour glass shape. Therefore, the stress can be mitigated by changing the shape of the narrow portion.

In FIG. 8, the largest stress in the side where the flexible wiring substrate 20 connects with the display panel 10 is 9, which is reduced compared with the structure of FIG. 7. Therefore, the stress generated in the display panel 10 as a reaction is also decreased.

FIG. 9 is a stress distribution when the flexible wiring substrate 20 according to the present invention is bent as shown FIG. 6. The numbers corresponding to the contours in FIG. 9 are values of stress, the unit is MPa. The stress in FIG. 9 is almost zero, which is very different from the stresses in FIGS. 7 and 8. Namely, no region exists where the stress is larger than 3 MPa in FIG. 9.

In FIG. 9, the stress is large as 5.8 MPa at the tip of the cut out 202; however, it is an abnormal point due to acute and sharp angle of the cut out 202, therefore, if the acute and sharp angle of the cut out 202 is substituted by a smooth curve, the stress can be substantially reduced. Anyway, the maximum stress is generated in the flexible wiring substrate 20 itself, thus, this stress does not generate the stress in the display panel 10 as a reaction.

As shown in FIG. 9, the stress is actually not generated in the flexible wiring substrate 20 according to the present invention when the display panel 10 is curved, therefore, a complex stress is not generated even when the flexible wiring substrate 20 is bent back; therefore, it can be considered as that a flat flexible wiring substrate 20 is bent back. The reason why the stress is reduced in the flexible wiring substrate 20 according to the present invention is the same as that explained in FIG. 3. In other words, the delta shaped cut outs 201 and 202 have a large influence.

Figure 10:
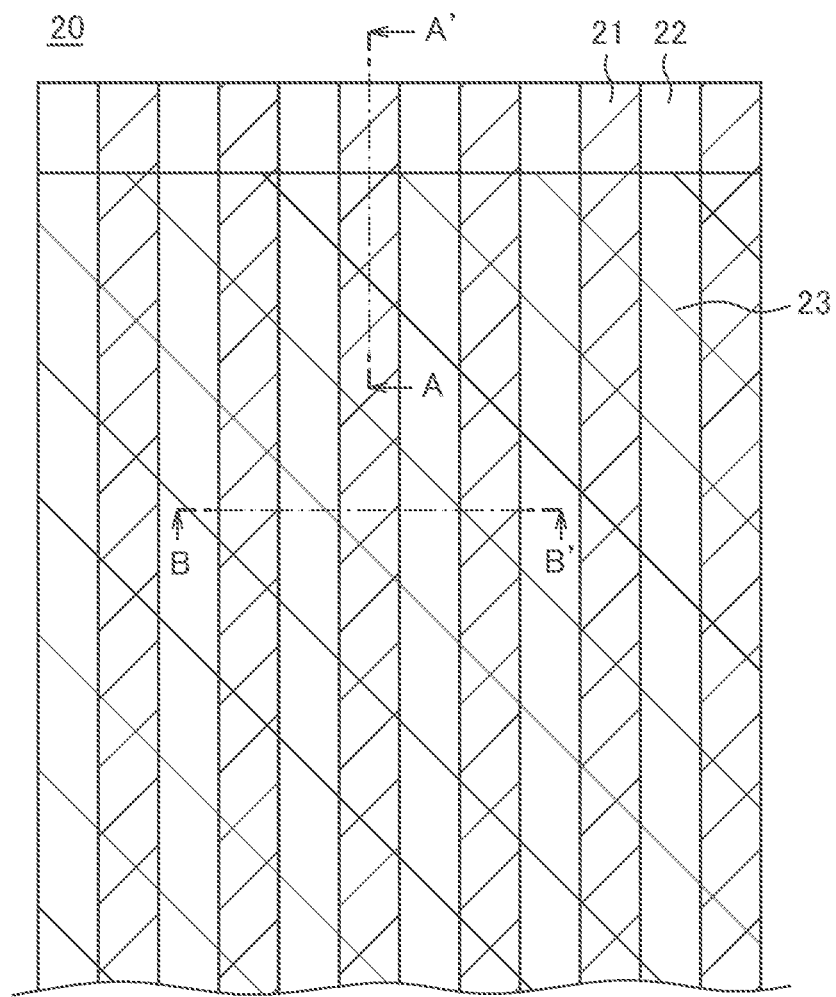
FIG. 10 is a plan view of the flexible wiring substrate.

FIG. 10 is a plan view of a general flexible wiring substrate 20. In FIG. 10, wirings 21, formed from e.g. cupper, is patterned on the substrate 22 formed from resin as e.g. polyimide. The protecting film 23 is formed to cover the cupper wirings 21. The protecting film 23 can be so called a solder resist. The protecting film 23 covers the cupper wirings 21 except terminal portions in which the cupper wirings connect with the display panel 10 or the wiring substrate 30.

Figure 11:
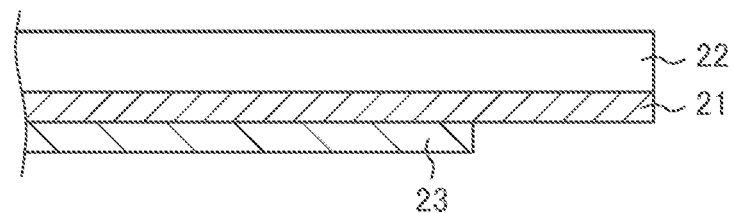
FIG. 11 is a cross sectional view of FIG. 10 along the line A-A'.
Figure 12:
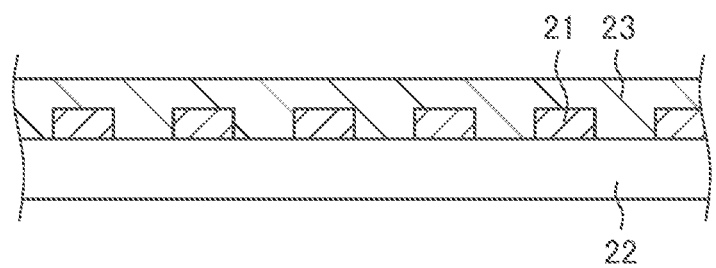
FIG. 12 is a cross sectional view of FIG. 10 along the line B-B'.

FIG. 11 is a cross sectional view of FIG. 10 along the line A-A'. FIG. 12 is a cross sectional view of FIG. 10 along the line B-B'. In FIGS. 11 and 12, the cupper wirings 21 are formed in predetermined pitch; the protecting film 23 is formed to cover the cupper wirings 21.

Figure 13:
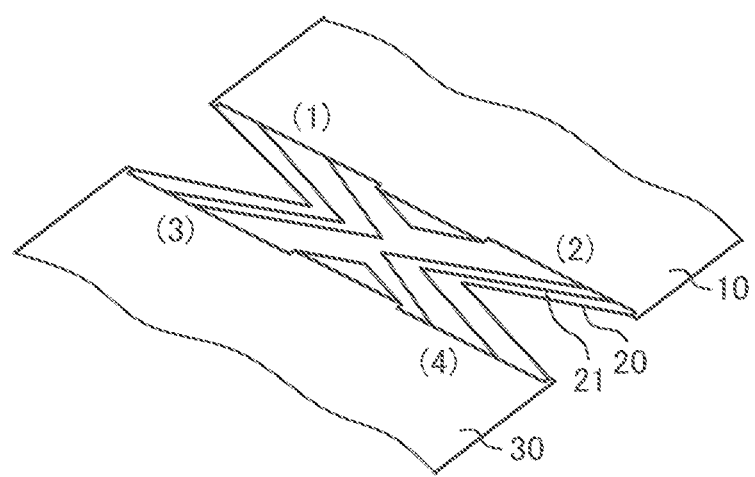
FIG. 13 is a plan view of a first example of the flexible wiring substrate according to the present invention.

FIG. 13 is an example of the flexible wiring substrate 20 according to the present invention. In FIG. 13, X shaped flexible wiring substrate 20 connects the display panel 10 with the wiring substrate 30. Since the wirings 21 in the flexible wiring substrate 20 of FIG. 13 is a single layer, the wirings 21 are V shaped. Namely, the wirings 21, connected at the region (1) with the display panel 10, bend at the center of the flexible wiring substrate 20 in V shape and connect with the wiring substrate 30 at the region (3). The wirings 21, connected at the region (2) with the display panel 10, bend at the center of the flexible wiring substrate 20 in V shape and connect with the wiring substrate 30 at the region (4).

The terminal region (1) can be paraphrased as a first terminal group of the flexible wiring substrate 20; the terminal region (2) can be paraphrased as a second terminal group of the flexible wiring substrate 20; the terminal region (3) can be paraphrased as a third terminal group of the flexible wiring substrate 20; the terminal region (4) can be paraphrased as a fourth terminal group of the flexible wiring substrate 20. Each of the first terminal group to the fourth terminal group is a terminal group consisting of plural terminals arranged in x direction. Terminal groups are also formed in the display panel 10 corresponding to the terminal groups of the flexible wiring substrate 20.

Figure 14:
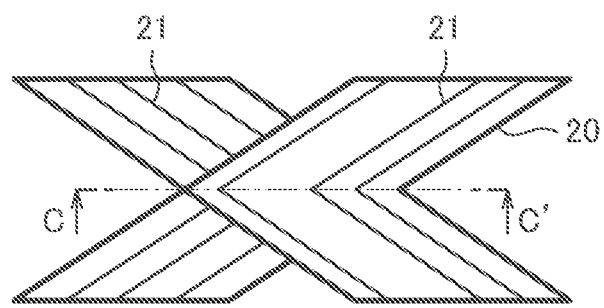
FIG. 14 is a plan view of a second example of the flexible wiring substrate according to the present invention.

FIG. 14 is a plan view of the X shaped flexible wiring substrate 20, which is formed from two of the V shaped flexible wiring substrates 20. In FIG. 14, V shaped wirings 21 are formed in each of the two V shaped flexible wiring substrates 20. The two V shaped wiring substrates 20 overlap at the V shaped bending portions; as a result, the plan view becomes X shape.

Figure 15:
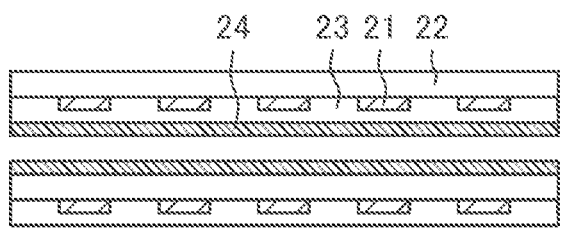
FIG. 15 is a cross sectional view of FIG. 14 along the line C-C'.

FIG. 15 is a cross sectional view of FIG. 14 along the line C-C'. The clock signals or video signals of high frequency are supplied to the wiring of each of the two flexible wiring substrate 20, therefore, an interference must be avoided. In FIG. 15, the conductive films 24 are formed on the opposing surfaces of the flexible wiring substrate 20 to avoid the interference. There is a space between the two wiring substrates 20 in FIG. 15; however, the space is just for depiction of two separate flexible wiring substrates 20; generally, the space is not necessary.

Figure 16:
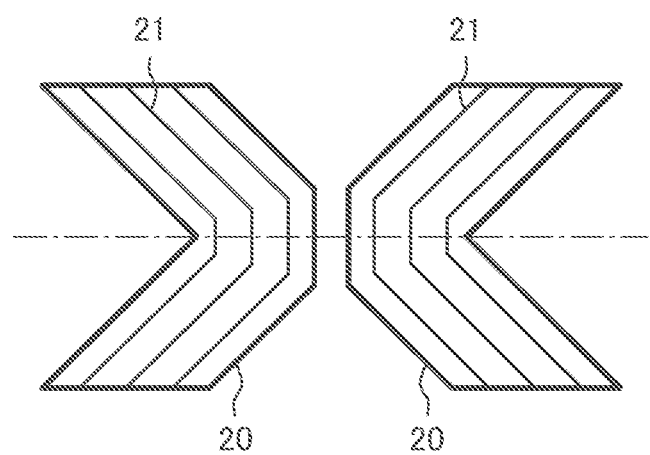
FIG. 16 is a plan view of a third example of the flexible wiring substrate according to the present invention.

FIG. 16 is an alternative example of FIGS. 14 and 15. FIG. 16 is a plan view in which the structure of FIG. 13 is formed from two deformed V shaped flexible wiring substrates 20. FIG. 16 differs from FIGS. 14 and 15 in that: the two V shaped flexible wiring substrate 20 do not overlap in a plan view; and the opposing portions of the two V shaped flexible wring substrates 20, at which the wirings bend, are truncated to be straight. Namely, each of the two flexible wiring substrates 20 has a V shaped cut out at one side and a straight portion at another side in the horizontal direction; the two flexible wiring substrates 20 are set side by side to form a X shaped flexible wiring substrate 20 as a total. Liberty in wring layout can be improved by forming a straight portion in the flexible wiring substrate 20.

Figure 17:
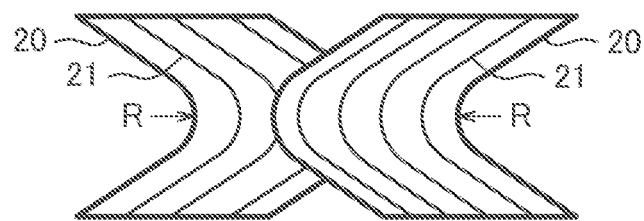
FIG. 17 is a plan view of a fourth example of the flexible wiring substrate according to the present invention.

FIG. 17 is a second alternative example of FIGS. 14 and 15. The stress tends to be high at the tip of the V shape in the V shaped flexible wiring substrate 20. Especially, when the wiring 21 is turned in V shape, and the flexible wiring substrates 20 is bent at this portion, a breaking of the wiring 21 tends to occur. In FIG. 17, the tip of the V shape is substituted by the arc to mitigate the stress. As a result, a breaking of the flexible wiring substrate 20 and disconnection of the wirings 21 can be avoided. The flexible wiring substrate 20 of FIG. 17 still maintain X shape in a plan view.

Figure 18:
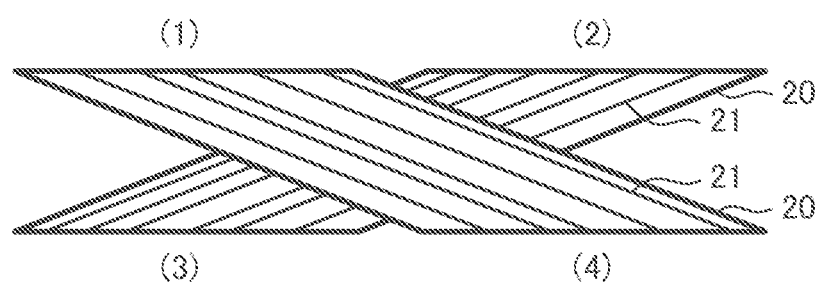
FIG. 18 is a plan view of a fifth example of the flexible wiring substrate according to the present invention.

In FIG. 18, the two flexible wiring substrates 20 of parallelogram are overlapped to form a X shaped flexible substrate 20 in a plan view. Since there is no bending portion in the wirings in each of the flexible wiring substrates 20, a risk of disconnection of the wirings 21 is very low. In FIG. 18, the terminal region (1) of the display device 10 and the terminal region (4) of the terminal substrate 30 are connected to each other by one flexible wiring substrate 20 and the terminal region (2) of the display device 10 and the terminal region (3) of the wiring substrate 30 are connected to each other by another flexible wiring substrate 20. The cross sectional view of the overlapped portion of the two wiring substrate 20 in FIG. 18 is the same as FIG. 15.

Figure 19:
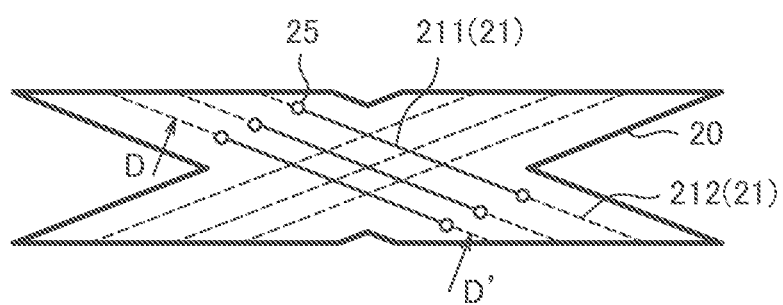
FIG. 19 is a plan view of a sixth example of the flexible wiring substrate according to the present invention.

FIG. 19 is an example in which the structure of the flexible wiring substrate 20 of FIG. 18 is formed by one X shaped flexible wiring substrate 20. In FIG. 19, the outer shape of the flexible wiring substrate 20 is X shape. The wirings 212 formed in the flexible wiring substrate 20 are formed on the rear surface of the substrate 22 as depicted by broken lines in FIG. 19. In the place where the wirings 212 intersect, one group of the wirings 212 connects with wirings 211 on the front surface via the through holes 25; then, after the intersect, the one group of the wirings 211 on the front surface connects with the wirings 212 on the rear surface via the through holes 25.

Figure 20:
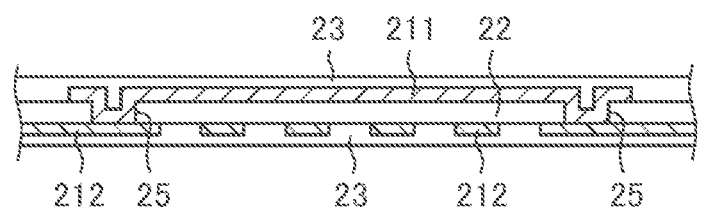
FIG. 20 is a cross sectional view of FIG. 19 along the line D-D'.

FIG. 20 is a cross sectional view of FIG. 19 along the line D-D'. In FIG. 20, the back wirings 212 are formed on the back surface of the substrate 22. The back wirings 212 connect with the front wirings 211 via the through holes 25 at the place of intersection; the front wirings 211 connect with the back wirings 212 via the through holes 25 after the intersection. Both the front wirings and the back wirings are covered by protecting film 23.

Figure 21:
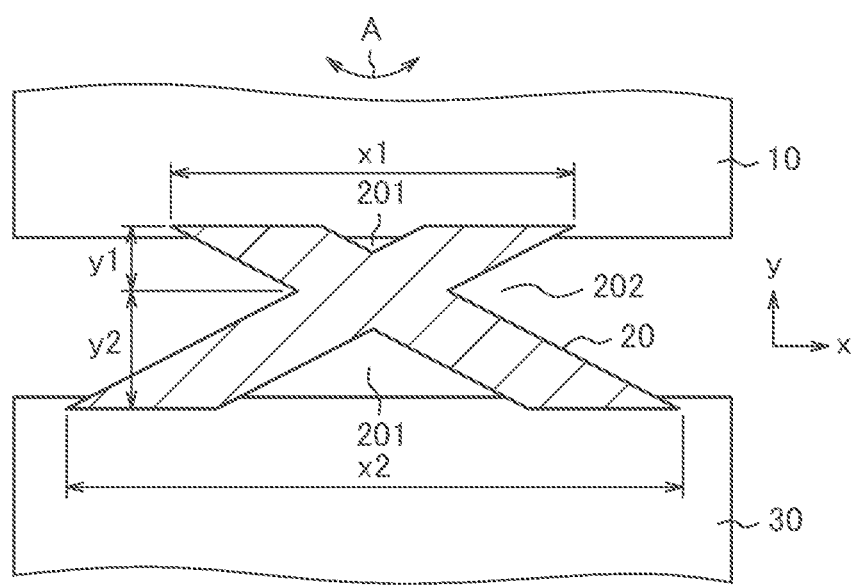
FIG. 21 is a plan view of a seventh example of the flexible wiring substrate according to the present invention.

FIG. 21 is an alternative example of the X shape flexible wiring substrate 20. The feature of FIG. 21 is that the intersection in X shape is nearer to the display device 10 than to the wiring substrate 30; in other words, y1<y2 and x1<x2. When the display device is curved as arrow A in FIG. 21 while the wiring substrate 30 is kept flat, a stress is generated in the flexible wiring substrate 20; the stress in the side of the display device 10 is smaller when x1 is smaller. Therefore, the structure of FIG. 21 has a merit to mitigate the stress in the display panel 10.

When the flexible wiring substrate 20 is folded back to the rear of the display panel 10, the flexible wiring substrate 20 is bent at the cross portion, namely, at the distance y1 from the top of the flexible wiring substrate 20. Since y1 is smaller than y2, the flexible wiring substrate 20 is bent in a radius of curvature smaller than (y1+y2)/2, which is a half of the length in y direction of the flexible wiring substrate 20.

Figure 22:
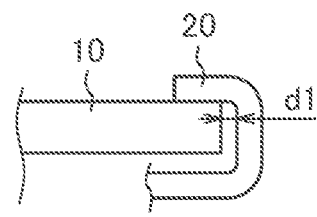
FIG. 22 is a cross sectional view in which the flexible wiring substrate of FIG. 21 is bent.

FIG. 22 is a cross sectional view when the flexible wiring substrate 20 is bent to the back of the display panel 10. The flexible wiring substrate 20 of the structure of FIG. 21 can be bent in a small radius, therefore, d1 in FIG. 22 can be made smaller. Thus, the outer size of the display device can be made smaller, especially, the frame width can be made narrower at the side where the flexible wiring substrate 20 is bent.

Figure 23:
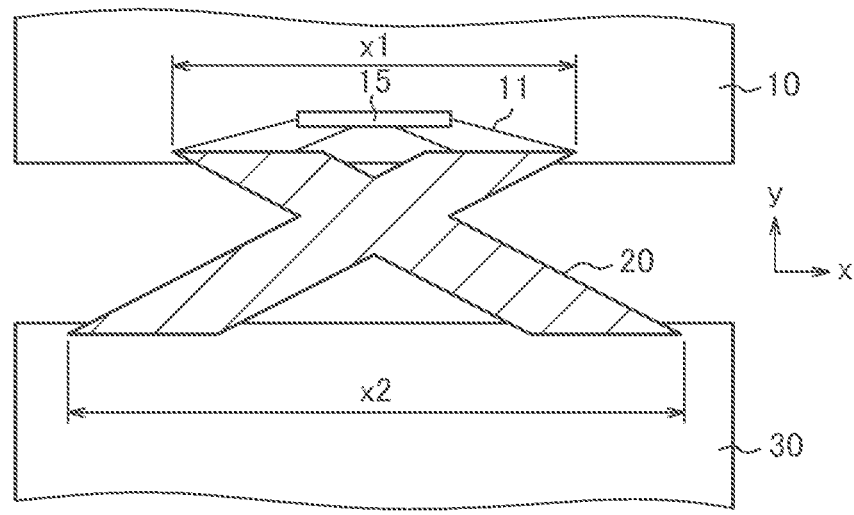
FIG. 23 is a plan view of an example of the flexible wiring substrate in which the driver IC and the wirings are added in the structure of FIG. 21.
Figure 24:
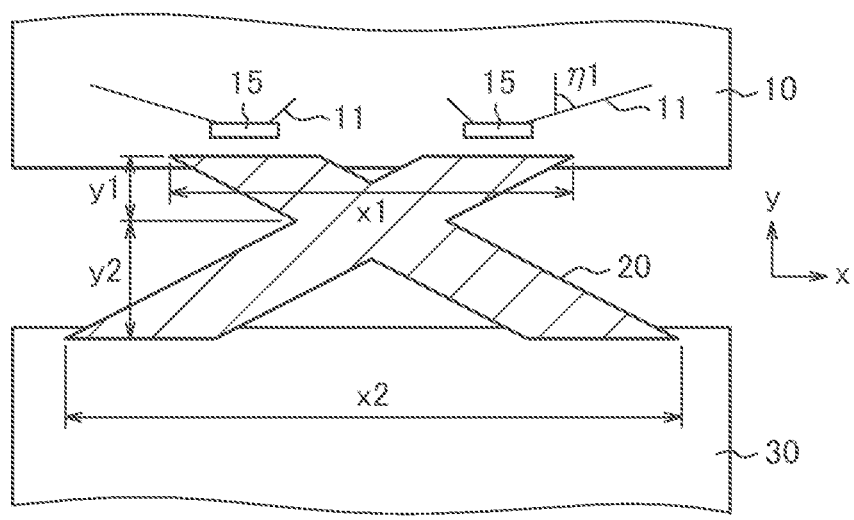
FIG. 24 is a plan view of another example of the flexible wiring substrate in which the driver IC and the wirings are added in the structure of FIG. 21.

FIG. 23 is an example in which the driver IC 15 is installed on the display panel 10. Since an upper width x1 of the flexible wiring substrate 20 is small, one driver IC 15 covers the wirings in FIG. 23. FIG. 24 is an example in which the two IC drivers 15 are provided in the display device 10 corresponding to the terminal regions of the flexible wiring substrate 20. Since the wirings 11 are dense specifically at two vertical sides of the display panel 10, extremely fine pitches in wirings, especially in the diagonal wirings, can be avoided by setting two driver ICs 15 as shown in FIG. 24.

Figure 25:
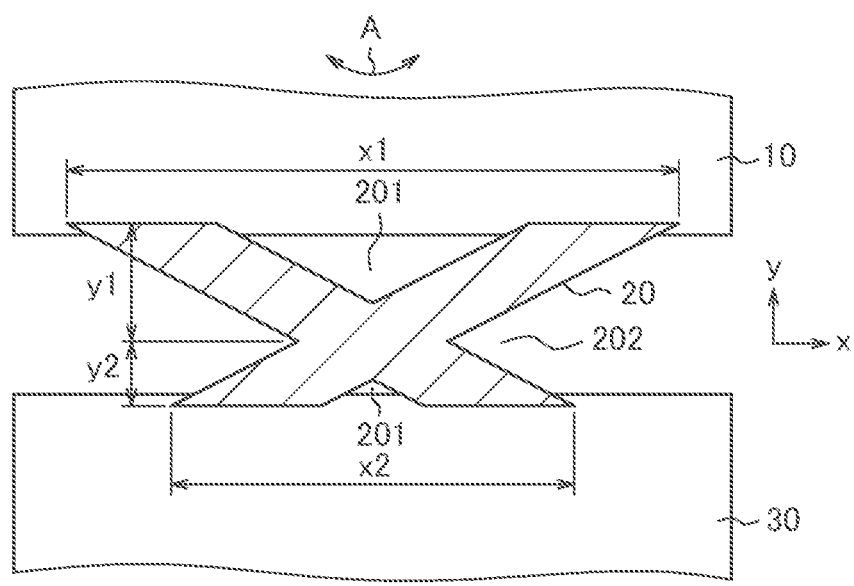
FIG. 25 is a plan view of an eighth example of the flexible wiring substrate according to the present invention.

FIG. 25 is another alternative example of the X shape flexible wiring substrate 20. The feature of FIG. 25 is that the intersection in X shape is nearer to the wiring substrate 30 than to the display device 10; in other words, y1>y2 and x1>x2. When the display device is curved as arrow A in FIG. 21 while the wiring substrate 30 is kept flat, a stress is generated in the flexible wiring substrate 20; the stress in the side of the display device 10 is larger when x1 is larger. Therefore, the structure of FIG. 25 is not necessarily so suitable when the display panel 10 is curved by a small radius of curvature.

When the flexible wiring substrate 20 is folded back to the rear of the display panel 10, the flexible wiring substrate 20 is bent at the cross portion, namely, at the distance y1 from the top of the flexible wiring substrate 20. Since y1 is larger than y2, the flexible wiring substrate 20 is bent in a radius of curvature larger than (y1+y2)/2, which is a half of the length in y direction of the flexible wiring substrate 20.

Figure 26:
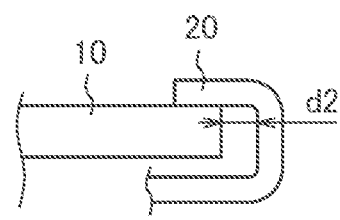
FIG. 26 is a cross sectional view in which the flexible wiring substrate of FIG. 25 is bent.

FIG. 26 is a cross sectional view when the flexible wiring substrate 20 of FIG. 25 is bent to the back of the display panel 10. The flexible wiring substrate 20 of the structure of FIG. 25 is to be bent in rather a larger radius; in other words, d2 in FIG. 26 is larger than d1 in FIG. 22. Therefore, the structure of 25 is not so suitable when the outer size of the display device is desired to be small.

Figure 27:
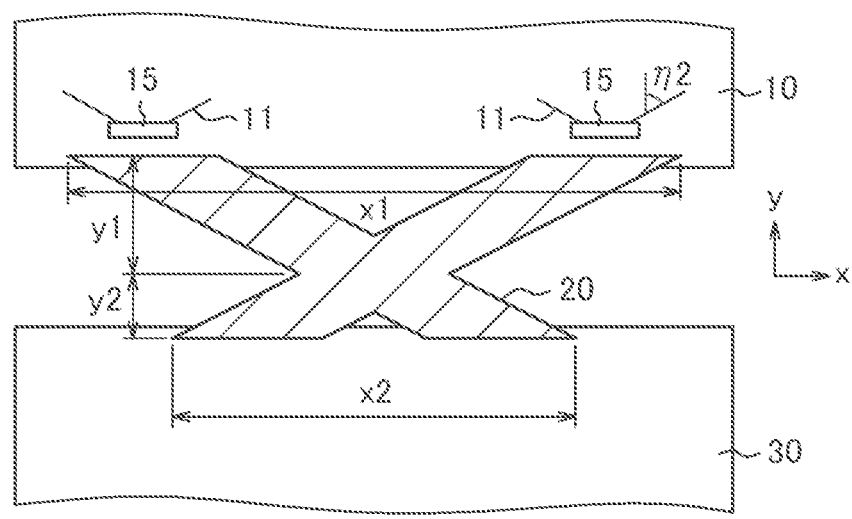
FIG. 27 is a plan view of an example of the flexible wiring substrate in which the driver IC and wirings are added in the structure of FIG. 25.

FIG. 27 is an example in which the driver ICs 15 are installed on the display panel 10 in the structure of FIG. 25.

In FIG. 27, the driver ICs 15 can be set further outer sides than the structure of FIG. 24. Even the wirings 11 are dense specifically at two vertical sides of the display panel 10, extremely fine pitches in wirings can be avoided by setting the driver ICs 15 at further outer sides as shown in FIG. 27. In other words, the angle of wiring η2 in FIG. 27 can be made smaller than the angle of wiring η1 in FIG. 24. Consequently, the pitches in the diagonal wirings 11 in the structure of FIG. 27 can be made lager, thus, design margin for layout of wirings can be increased.

In the above explanations, the driver ICs 15 are set on the display panel 10 by so called COG (Chip On Glass). However, the relation between the driver IC 15 and the flexible wiring substrate 20 are not limited in that structure; the driver IC 15 can be installed on the X shaped flexible wiring substrate 20 according to the present invention; this structure is referred to as COF (Chip On Film).

Figure 28:
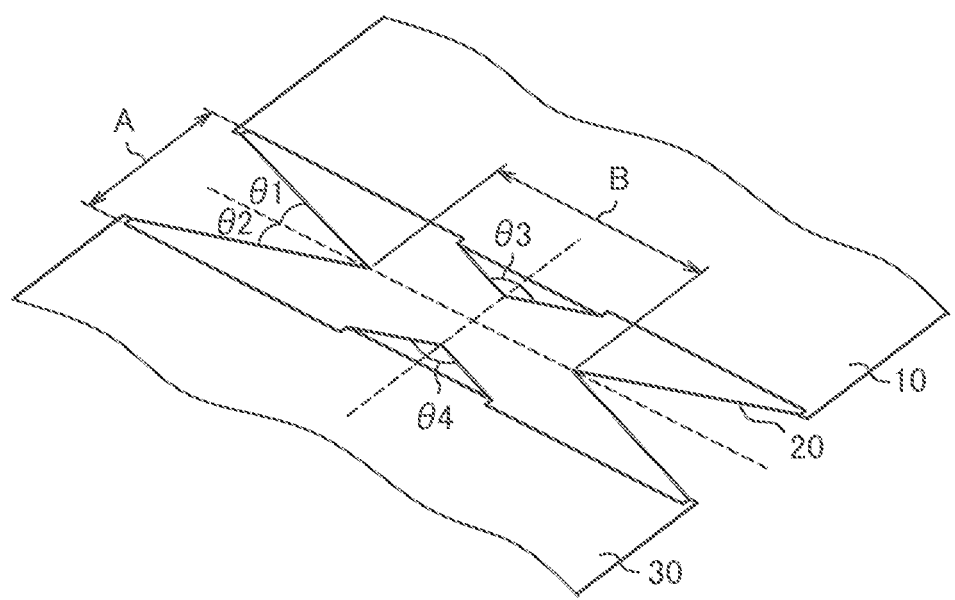
FIG. 28 is a plan view of a general structure of the flexible wiring substrate according to the present invention.

FIG. 28 is a perspective view of a general shape of the flexible wiring substrate 20 according to the present invention. A general shape of the flexible wiring substrate 20 according to the present invention is X shaped, however, this X shape is not necessarily constituted from crossed parallelograms In FIG. 28, θ1 and θ2 are not necessarily the same value. Each of θ1 and θ2 can take a value between 10 degrees to 80 degrees. In FIG. 28, if θ1+θ2<θ3, it is emphasized that the flexible wiring substrate 20 is longer in horizontal direction. The value of θ1+θ2 can be set between 20 degrees and 90 degrees. The values of θ3 are preferably set as 180 degrees minus 2×θ1; the value of θ4 is preferably set as 180 degrees minus 2×θ2. Each of the values of θ3 and θ4 are set larger than 90 degrees and smaller than 180 degrees.

When the display panel 10 is curved as shown in FIGS. 1 to 3, and the flexible wiring substrate 20 is bent back to the rear of the display panel 10, in the structure of FIG. 28, the stress in the flexible wiring substrate 20 and the stress as a reaction in the display panel 10 can be reduced by making the length A longer, and making the length B shorter.

Figure 29:
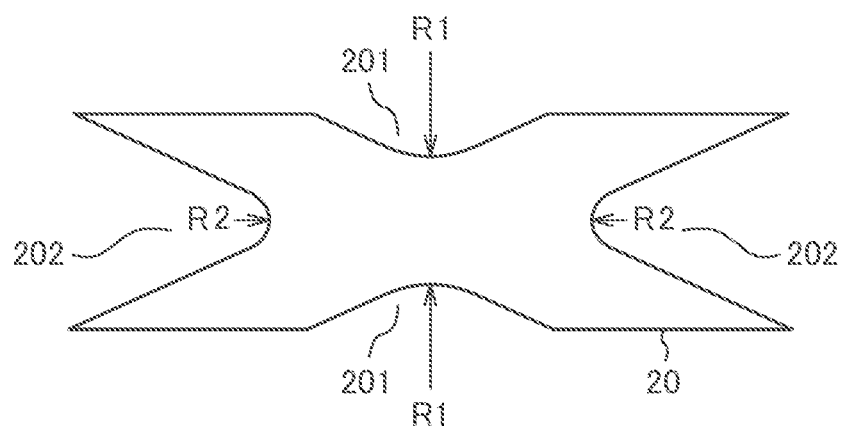
FIG. 29 is a plan view of a ninth example of the flexible wiring substrate according to the present invention.

FIG. 29 is a plan view of another example of X shaped flexible wiring substrate 20 according to the present invention. The feature of the flexible wiring substrate 20 of FIG. 29 is that V shaped tips in the cut outs 201 and 202 are substituted by smooth curves as a radius of curvature R1 and a radius of curvature R2. Thus, local large stress in the flexible wiring substrate 20 can be avoided; consequently, disconnections in the wirings 21 in the flexible wiring substrate 20 can be avoided.

Figure 30:
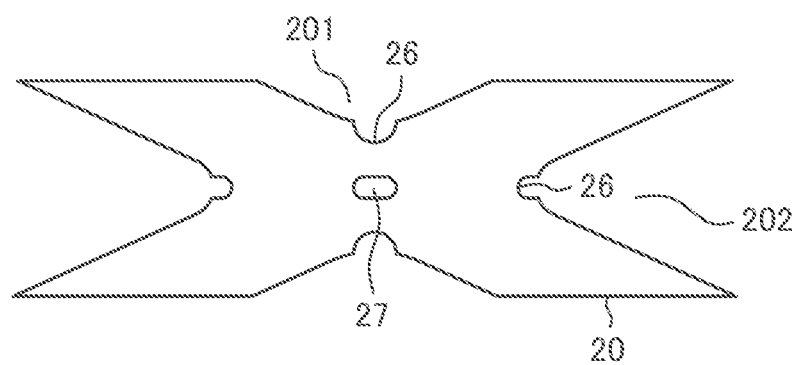
FIG. 30 is a plan view of a tenth example of the flexible wiring substrate according to the present invention.

FIG. 30 is a plan view of yet another example of X shaped flexible wiring substrate 20 according to the present invention. The feature of the flexible wiring substrate 20 of FIG. 30 is that notches 26 are formed at the portions where large stress is generated to avoid a local large stress in the flexible wiring substrate 20. Another feature of the structure of FIG. 30 is that a slit 27 is formed at the center of the flexible wiring substrate 20. The slit 27 mitigates the stress when the flexible wiring substrate 20 is bent back to the rear of the display panel 10; as a result, the stress as a reaction in the display panel 10 is also mitigated.

Figure 31:
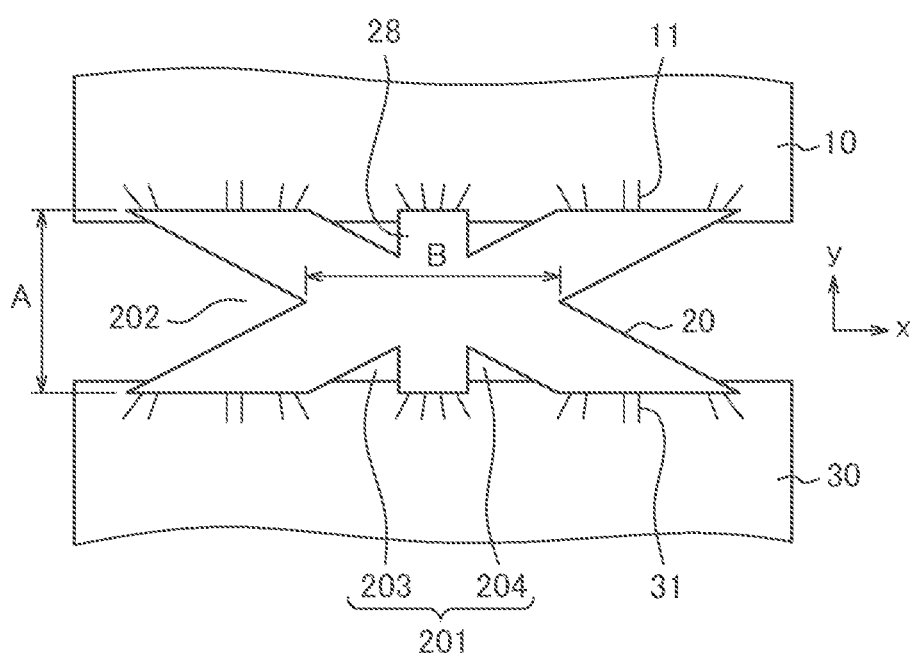
FIG. 31 is a plan view of an eleventh example of the flexible wiring substrate according to the present invention.

FIG. 31 is a plan view of yet another example of X shaped flexible wiring substrate 20 according to the present invention. The feature of the flexible wiring substrate 20 of FIG. 31 is that central projections 28 are formed; the central projections 28 extend in y direction or −y direction at the center in x direction of the flexible wiring substrate 20. The cut out 201 is divided into cut out 203 and cut out 204 by the central projection 28.

The wirings 21 are formed also in the central projections 28, and the wirings 21 are connected to the display panel 10 and to the circuit substrate 30. Therefore, the flexible wiring substrate 20 of FIG. 31 connects to the display panel 10 and to the wring substrate 30 at three regions; thus, design liberty in wiring can be increased as well as the bending stress can be mitigated. In the structure of FIG. 31, easiness of bending of the flexible wiring substrate 20 and generation of stress in the flexible wiring substrate 20 are adjusted by the length A and the length B as other example of X shaped flexible wiring substrate 20.

What is claimed is:

1. A display device comprising:
a display panel having a first side extending in a first direction,
a wiring substrate having a second side extending in the first direction, and
a flexible wiring substrate connecting the display device with the wiring substrate in a second direction, which intersects with the first direction,
wherein the flexible wiring substrate connects with the display panel at a first region and a second region, the first region and the second region are separated in the first direction,
the flexible wiring substrate connects with the wiring substrate at a third region and a fourth region, the third region and the fourth region are separated in the first direction,
the flexible wiring substrate has a first wiring group, which extends obliquely with the first direction or the second direction, and a second wiring group, which extends obliquely with the first direction or the second direction,
the first wiring group connects the first region with either one of the third region and the fourth region,
the second wiring group connects the second region with either another one of the third region and the fourth region,
the flexible wiring substrate has a width w1 in the first direction between an outer edge of the first region and an outer edge of the second region,
the flexible wiring substrate has a width w2 in the first direction between an outer edge of the third region and an outer edge of the fourth region, and
the flexible wiring substrate has a portion of shortest width w3 in the first direction between the first region and the third region, and between the second region and the fourth region.

2. The display device according to claim 1, wherein the first width w1 and the second width w2 are equal.

3. The display device according to claim 1, wherein the portion of shortest width w3 in the first direction is located at a center in the second direction between the first region and the third region or between the second region and the fourth region.

4. The display device according to claim 1, wherein the first width w1 is shorter than the second width w2.

5. The display device according to claim 1, wherein the portion of shortest width w3 in the first direction is located nearer to the display panel than the wiring substrate.

6. The display device according to claim 1, wherein the first wiring group connects the first region with the third region, the second wiring group connects the second region with the fourth region,
the first wiring group bends at the portion of width w3 in V shape in a plan view, and
the second wiring group bends at the portion of width w3 in V shape in a plan view in a opposite bending direction to the bending direction of the first wiring group.

7. The display device according to claim 1, wherein the first wiring group connects the first region with the fourth region, the second wiring group connects the second region with the third region, and
an insulating film is formed between the first wiring group and the second wiring group at a position in which the first wiring group and the second wiring group cross.

8. The display device according to claim 7, wherein the insulating film is a base substrate of the flexible wiring substrate.

9. The display device according to claim 1, wherein the flexible wiring substrate connects with the display device at a fifth region, which is between the first region and the second region, the fifth region and the first region are separated and the fifth region and the second region are separated, and
the flexible wiring substrate connects with the wiring substrate at a sixth region, which is between the third region and the fourth region, the sixth region and the third region are separated and the sixth region and the fourth region are separated,
the flexible wiring substrate has extending portions in the second direction between the fifth region and the sixth region.

10. The display device according to claim 1, wherein the display device curves along the first direction.

11. The display device according to claim 10, wherein the wiring substrate is turned back to a back of the display panel via the flexible wiring substrate.

12. A display device comprising:
a display panel having a first side extending in a first direction,
a wiring substrate having a second side extending in the first direction,
a first flexible wiring substrate connecting the display device with the wiring substrate in a second direction, which intersects with the first direction, and
a second flexible wiring substrate connecting the display device with the wiring substrate in the second direction,
wherein the first flexible wiring substrate connects with the display panel at a first region, and connects with the wiring substrate at a third region, the first region and the third region are connected to each other by a first wiring group,
the second flexible wiring substrate connects with the display panel at a second region, and connects with the wiring substrate at a fourth region, the second region and the fourth region are connected to each other by a second wiring group,
the first wiring group of the first wiring substrate has a first V shape including a first vertex in the first direction between the first region and the third region,
the second wiring group of the second wiring substrate has a second V shape including a second vertex in a reverse direction to the first direction between the second region and the fourth region,
the first flexible wiring substrate and the second flexible wiring substrate overlap at an overlapping portion as that the first V shape and the second V shape overlap,
in an assembled state of the first flexible wiring substrate and the second wiring substrate, the first region and the second region are separated in a plan view, the third region and the fourth region are separated in a plan view, a width in the first direction between an outer edge of the first region and an outer edge of the second region is w1, a width in the first direction between an outer edge of the third region and an outer edge of the fourth region is w2, and a narrowest width w3 in the first direction exists at the overlapping portion.

13. The display device according to claim 12, wherein a conductive film is formed between the first wiring group and the second wiring group.

14. A display device comprising:

a display panel having a first side extending in a first direction, a wiring substrate having a second side extending in the first direction, a first flexible wiring substrate connecting the display device with the wiring substrate in a second direction, which intersects with the first direction, and a second flexible wiring substrate connecting the display device with the wiring substrate in the second direction, wherein the first flexible wiring substrate connects with the display panel at a first region, and connects with the wiring substrate at a fourth region, the first region and the fourth region are connected to each other by a first wiring group, the second flexible wiring substrate connects with the display panel at a second region, and connects with the wiring substrate at a third region, the second region and the third region are connected to each other by a second wiring group, the first wiring group of the first wiring substrate extends straightly and diagonally between the first region and the fourth region, the second wiring group of the second wiring substrate extends straightly and diagonally between the second region and the third region, the first flexible wiring substrate and the second flexible wiring substrate cross and overlap at an overlapping portion between the first region and the fourth region and between the second region and the third region, in an assembled state of the first flexible wiring substrate and the second wiring substrate, the first region and the second region are separated in a plan view, the third region and the fourth region are separated in a plan view, a width in the first direction between an outer edge of the first region and an outer edge of the second region is w1, a width in the first direction between an outer edge of the third region and an outer edge of the fourth region is w2, and a narrowest width w3 in the first direction exists at the overlapping portion.

15. The display device according to claim 14, wherein a conductive film is formed between the first wiring group and the second wiring group.

\* \* \* \* \*